US012677711B2

(12) United States Patent
Zeng et al.

(10) Patent No.: US 12,677,711 B2
(45) Date of Patent: Jul. 7, 2026

(54) DIRECT PLUG-IN LED LAMP BEAD WITH INTERNAL RESISTOR

(71) Applicant: Linhai Qinghui Light Electricity Lamp Co., Ltd., Taizhou (CN)

(72) Inventors: Yongfu Zeng, Loudi (CN); Zhangyou Wu, Taizhou (CN)

(73) Assignee: Linhai Qinghui Light Electricity Lamp Co., Ltd., Taizhou (CN)

( * ) Notice: Subject to any disclaimer, the term of this patent is extended or adjusted under 35 U.S.C. 154(b) by 363 days.

(21) Appl. No.: 18/499,599

(22) Filed: Nov. 1, 2023

(65) Prior Publication Data

US 2025/0140764 A1 May 1, 2025

(51) Int. Cl.
| | |
|---|---|
| *H01L 25/16* | (2023.01) |
| *H01L 23/00* | (2006.01) |
| *H01L 33/62* | (2010.01) |
| *H10H 20/857* | (2025.01) |
| *H10W 90/00* | (2026.01) |
| *H10W 72/30* | (2026.01) |

(52) U.S. Cl.
CPC .......... *H10W 90/00* (2026.01); *H10H 20/857* (2025.01); *H10W 72/352* (2026.01); *H10W 90/751* (2026.01); *H10W 90/759* (2026.01)

(58) Field of Classification Search
CPC ....... H01L 25/167; H01L 24/29; H01L 24/48; H01L 2224/29139; H01L 2224/48195; H01L 2224/48221; H01L 2924/12041; H01L 2924/19043; H10H 20/857
USPC ........................................................... 257/81
See application file for complete search history.

(56) References Cited

U.S. PATENT DOCUMENTS

| | | | | |
|---|---|---|---|---|
| 3,875,456 A * | 4/1975 | Kano | ...................... | H05B 33/00 |
| | | | | 257/E33.059 |
| 6,091,084 A * | 7/2000 | Fujii | .................... | H10H 20/857 |
| | | | | 257/E33.056 |
| 2011/0101409 A1* | 5/2011 | Barnett | ................. | H01L 25/167 |
| | | | | 257/E23.001 |
| 2011/0255281 A1* | 10/2011 | Takei | ................... | H10H 20/856 |
| | | | | 257/E33.072 |
| 2018/0294381 A1* | 10/2018 | Wu | ........................ | H10H 20/831 |
| 2024/0288150 A1* | 8/2024 | He | ........................ | F21V 15/013 |

* cited by examiner

*Primary Examiner* — Tong-Ho Kim
(74) *Attorney, Agent, or Firm* — Westbridge IP LLC

(57) ABSTRACT

Disclosed is a direct plug-in LED lamp bead with an internal resistor. An LED luminous chip is fixed in a bowl-shaped stand with a special adhesive, a resistor chip is fixed to a flat stand with the adhesive, the LED luminous chip has an electrode electrically connected to the bowl-shaped stand through conductive filaments, as well as an electrode electrically connected to one end of the resistor chip through the conductive filaments, and the other end of the resistor chip is electrically connected to the flat stand. The direct plug-in LED lamp bead with an internal resistor has a wider application range.

9 Claims, 1 Drawing Sheet

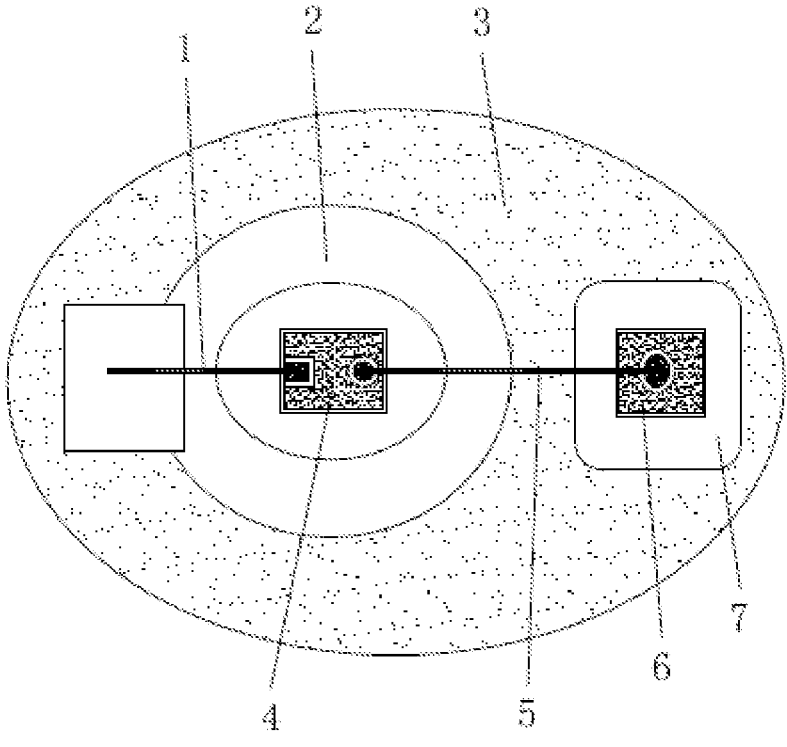

DIRECT PLUG-IN LED LAMP BEAD WITH INTERNAL RESISTOR

TECHNICAL FIELD

The application belongs to the technical field of light-emitting diodes (LEDs), and particularly relates to a direct plug-in LED lamp bead with an internal resistor.

BACKGROUND

LED lamps are low in energy consumption, high in luminous efficiency, free of radiation and long in service life, thus being widely developed in recent years. Common LED lamps are composed of positive and negative pin holders, an LED luminous chip and a sealing adhesive. The voltage of existing LED lamp beads is generally 1.8 V-3.6 V, and in use, high-voltage products often need to be connected to an external resistor or a dedicated power supply system needs to be designed, increasing the processing difficulty (particularly for products comprising a circuit boards and modules, such as LED decorations and lamps) and affecting the appearance design and aesthetics of the products. In view of this, it is necessary to provide a practical LED lamp bead with a wider voltage range.

SUMMARY

The objective of the application is to provide a direct plug-in LED lamp bead with an internal resistor.

The objective of the application is fulfilled as follows.

A direct plug-in LED lamp bead with an internal resistor comprises a metal bowl-shaped stand, a flat stand, an LED luminous chip, conductive filaments and a special adhesive, wherein the LED luminous chip is fixed in a bowl of the bowl-shaped stand with the special adhesive, a resistor chip is fixed to the flat stand with the adhesive, the LED luminous chip has an electrode electrically connected to the bowl-shaped stand through the conductive filaments, as well as an electrode electrically connected to one end of the resistor chip through the conductive filaments, the other end of the resistor chip is electrically connected to the flat stand, the blow-shaped stand, the flat stand, the LED luminous chip, the resistor chip and the conductive filaments are integrally packaged with transparent epoxy resin, and pins of the bowl-shaped stand and the flat stand stretch out of an epoxy resin package.

The LED luminous chip is fixed in the bowl of the bowl-shaped stand with a conductive silver adhesive.

The LED luminous chip is a single-wire LED luminous chip of a vertical structure, and the single-wire LED luminous chip of the vertical structure is fixed in the bowl-shaped stand with a conductive silver adhesive.

The LED luminous chip is a double-wire LED luminous chip of a planar structure, and the double-wire LED luminous chip of the planar structure is fixed in the bowl-shaped stand with an insulating adhesive.

The resistor chip is fixed to the flat stand with a conductive silver adhesive.

The LED luminous chip between the LED luminous chip and the epoxy resin package is coated with a fluorescent powder.

The LED luminous chip is a visible light chip not coated with a fluorescent powder.

The fluorescent powder is one of fluorescent powders allowing the LED luminous chip to emit red light, yellow light, green light, blue light, orange light, pink light, violet light, white light, and warm white light.

The LED luminous chip is one of red, yellow, blue, green, orange and violet visible light chips.

The LED luminous chip is an infrared or ultraviolet invisible light chip.

Compared with the prior art, the application has the following outstanding and beneficial technical effects.

The LED lamp bead provided by the application can be directly applied to any products with a voltage within 2-36 V, thus compared with traditional LED lamp beads with a voltage within 2-3.6 V, having a wider application range.

The LED lamp bead provided by the application is suitable for direct plug-in LED lamp beads for assembling various LED products such as various LED light strings, LED modules, LED indicator lights and other LED lights.

BRIEF DESCRIPTION OF THE DRAWINGS

FIG. 1 is a schematic structural diagram of the application.

DETAILED DESCRIPTION OF THE EMBODIMENTS

The application will be further described below in conjunction with accompanying drawings and specific embodiments. Referring to FIG. 1.

A direct plug-in LED lamp bead with an internal resistor comprises a metal bowl-shaped stand 2, a flat stand 7, an LED luminous chip 4, conductive filaments 1 and 5, and a special adhesive, wherein the LED luminous chip 4 is fixed in a bowl of the bowl-shaped stand 2 with the special adhesive, a resistor chip 6 is fixed to the flat stand 7 with the adhesive, the conductive filaments 1 and 5 are electrically connected to bowl-shaped stand 2 through one electrode of the LED luminous chip 4 using a mature LED pressure welding technique, the other electrode of the LED luminous chip 4 is electrically connected to one end of the resistor chip 6 through the conductive filaments 1 and 5, the other end of the resistor chip 6 is electrically connected to the flat stand 7, the blow-shaped stand 2, the flat stand 7, the LED luminous chip 4, the resistor chip 6 and the conductive filaments 1 and 5 are integrally packaged with transparent epoxy resin 3, and pins of the bowl-shaped stand 2 and the flat stand 7 stretch out of an epoxy resin 3 package.

The LED luminous chip 4 is fixed in the bowl of the bowl-shaped stand 2 with a conductive silver adhesive.

The LED luminous chip 4 is a single-wire LED luminous chip 4 of a vertical structure, and the single-wire LED luminous chip 4 of the vertical structure is fixed in the bowl of the bowl-shaped stand 2 with a conductive silver adhesive; in a case where the LED luminous chip 4 is a positive LED luminous chip, the bowl-shaped stand is negative; and in a case where the LED luminous chip 4 is a negative LED luminous chip, the bowl-shaped stand is positive.

The LED luminous chip 4 is a double-wire LED luminous chip 4 of a planar structure, and the double-wire LED luminous chip 4 of the planar structure is fixed in the bowl of the bowl-shaped stand 2 with an insulating adhesive; in a case where a negative pole of the LED luminous chip 4 is connected to the bowl-shaped stand 2, the bowl-shaped stand 2 is negative; and in a case where a positive pole of the LED luminous chip 4 is connected to the bowl-shaped stand 2, the bowl-shaped stand is positive.

The resistor chip 6 is fixed to the flat stand 7 with a conductive silver adhesive.

3

The LED luminous chip 4 between the LED luminous chip 4 and the epoxy resin 3 package is coated with a fluorescent powder.

The LED luminous chip 4 is a visible light chip not coated with a fluorescent powder.

The fluorescent powder is one of fluorescent powders allowing the LED luminous chip 4 to emit red light, yellow light, green light, blue light, orange light, pink light, violet light, white light, and warm white light.

The LED luminous chip 4 is one of red, yellow, blue, green, orange and violet visible light chips. The LED luminous chip 4 is an infrared or ultraviolet invisible light chip.

The above embodiments are merely preferred ones of the application, and are not intended to limit the protection scope of the application. Therefore, all equivalent modifications made according to the structure, shape and principle of the application should also fall within the protection scope of the application.

What is claimed is:

1. A direct plug-in light-emitting diode (LED) lamp bead with an internal resistor, comprising a metal bowl-shaped stand, a flat stand, an LED luminous chip, conductive filaments and a special adhesive, wherein the LED luminous chip is fixed in a bowl of the bowl-shaped stand with the special adhesive, a resistor chip is fixed to the flat stand with the adhesive, the LED luminous chip has an electrode electrically connected to the bowl-shaped stand through the conductive filaments, as well as an electrode electrically connected to one end of the resistor chip through the conductive filaments, the other end of the resistor chip is electrically connected to the flat stand, the bowl-shaped stand, the flat stand, the LED luminous chip, the resistor chip and the conductive filaments are integrally packaged with transparent epoxy resin, and pins of the bowl-shaped stand and the flat stand stretch out of an epoxy resin package; and

the resistor chip is fixed to the flat stand with a conductive silver adhesive.

2. The direct plug-in LED lamp bead with the internal resistor according to claim 1, wherein the LED luminous chip is fixed in the bowl of the bowl-shaped stand with a conductive silver adhesive.

3. The direct plug-in LED lamp bead with the internal resistor according to claim 1, wherein the LED luminous chip is a single-wire LED luminous chip of a vertical structure.

4. The direct plug-in LED lamp bead with the internal resistor according to claim 1, wherein the LED luminous chip is a double-wire LED luminous chip of a planar structure.

5. The direct plug-in LED lamp bead with the internal resistor according to claim 1, wherein the LED luminous chip between the LED luminous chip and the epoxy resin package is coated with a fluorescent powder.

6. The direct plug-in LED lamp bead with the internal resistor according to claim 5, wherein the fluorescent powder is one of fluorescent powders allowing the LED luminous chip to emit red light, yellow light, green light, blue light, orange light, pink light, violet light, white light, and warm white light.

7. The direct plug-in LED lamp bead with the internal resistor according to claim 1, wherein the LED luminous chip is a visible light chip not coated with a fluorescent powder.

8. The direct plug-in LED lamp bead with the internal resistor according to claim 1, wherein the LED luminous chip is one of red, yellow, blue, green, orange and violet visible light chips.

9. The direct plug-in LED lamp bead with the internal resistor according to claim 1, wherein the LED luminous chip is an infrared or ultraviolet invisible light chip.

* * * * *